(12) United States Patent
Kutsuna et al.

(10) Patent No.: US 11,543,480 B2
(45) Date of Patent: Jan. 3, 2023

(54) IMAGE GENERATING APPARATUS, IMAGE GENERATING METHOD, AND NON-VOLATILE COMPUTER-READABLE STORAGE MEDIUM STORING THEREIN IMAGE GENERATING PROGRAM

(71) Applicant: CANON MEDICAL SYSTEMS CORPORATION, Otawara (JP)

(72) Inventors: Hideaki Kutsuna, Kawasaki (JP); Masahito Nambu, Utsunomiya (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/391,758

(22) Filed: Aug. 2, 2021

(65) Prior Publication Data

US 2022/0091212 A1    Mar. 24, 2022

(30) Foreign Application Priority Data

Sep. 18, 2020   (JP) .............................. JP2020-157877

(51) Int. Cl.
*G01R 33/561* (2006.01)
*G01R 33/36* (2006.01)
*G01R 33/48* (2006.01)

(52) U.S. Cl.
CPC ...... *G01R 33/5611* (2013.01); *G01R 33/3607* (2013.01); *G01R 33/4824* (2013.01)

(58) Field of Classification Search
CPC ............ G01R 33/3607; G01R 33/4824; G01R 33/5611
See application file for complete search history.

(56) References Cited

U.S. PATENT DOCUMENTS

| 2008/0154115 | A1 | 6/2008 | Fuderer et al. | |
| 2017/0074959 | A1* | 3/2017 | Li | G01R 33/5676 |
| 2019/0195975 | A1* | 6/2019 | Liu | G01R 33/583 |

OTHER PUBLICATIONS

Jackson, J et al. "Selection of a Convolution Function for Fourier Inversion Using Gridding", IEEE Transactions on Medical Imaging, vol. 10, No. 3, 1991, pp. 473-478.
Pruessmann, K et al. "Sense: Sensitivity Encoding for Fast MRI", Magnetic Resonance in Medicine, 1999; pp. 952-962.

* cited by examiner

*Primary Examiner* — Gregory H Curran
(74) *Attorney, Agent, or Firm* — Oblon, McClelland, Maier & Neustadt, L.L.P.

(57) ABSTRACT

An image generating apparatus according to an embodiment includes processing circuitry. The processing circuitry obtains a coil sensitivity distribution indicating a sensitivity distribution of a reception coil used for an imaging process performed on an examined subject and magnetic resonance data acquired from the imaging process that is non-Cartesian and performed in a k-space. The processing circuitry performs, on the basis of the coil sensitivity distribution, registration between the coil sensitivity distribution and a gridding sensitivity distribution indicating a distribution of gridding sensitivity related to arranging the magnetic resonance data in the k-space. The processing circuitry generates a magnetic resonance image on the basis of a result of the registration, magnetic resonance data, coil sensitivity distribution, and gridding sensitivity distribution.

13 Claims, 8 Drawing Sheets

FIG.6
| | COMPARISON EXAMPLE | RESULT OF IMAGE GENERATING PROCESS |
|---|---|---|
| MR IMAGE | 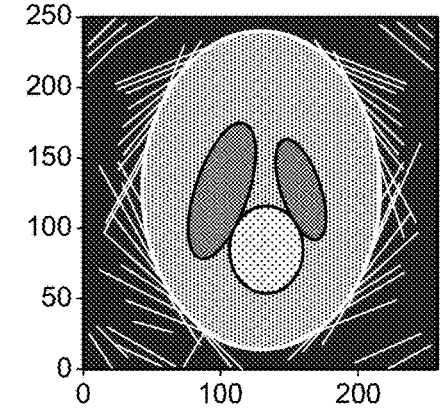 | 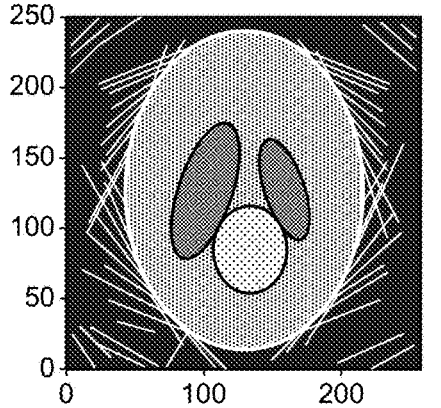 |
| DIFFERENCE FROM CORRECT ANSWER IMAGE | 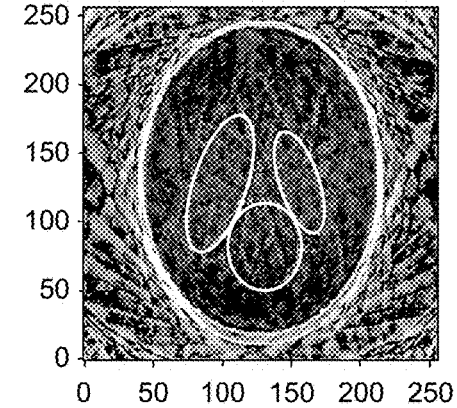 | 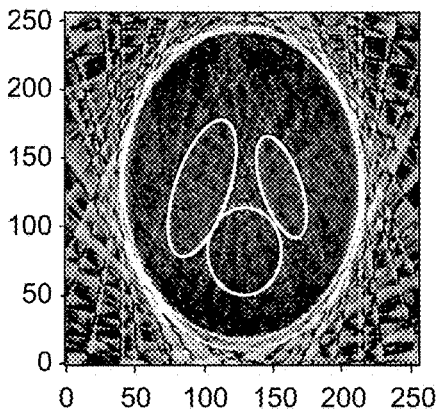 |

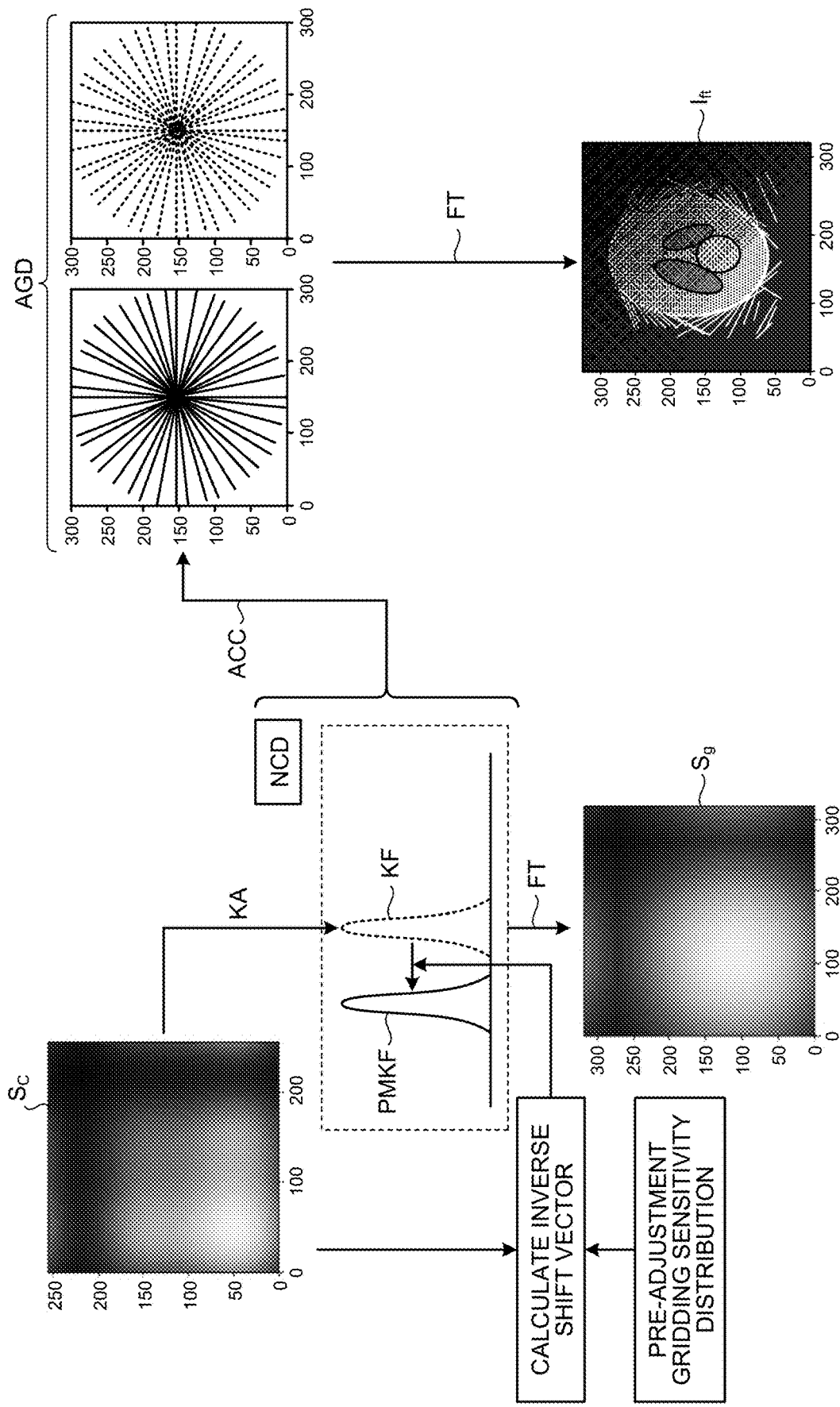

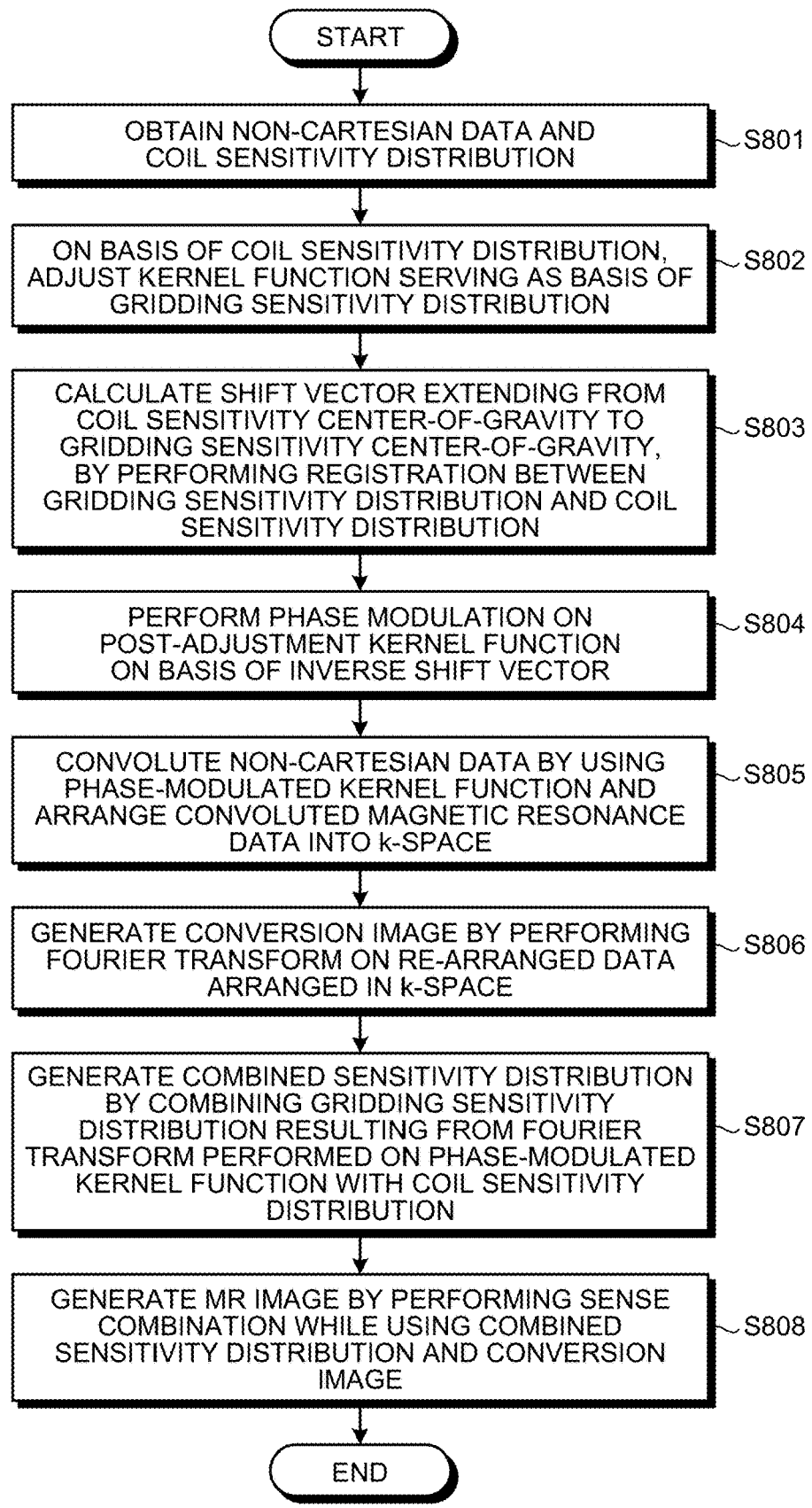

IMAGE GENERATING APPARATUS, IMAGE GENERATING METHOD, AND NON-VOLATILE COMPUTER-READABLE STORAGE MEDIUM STORING THEREIN IMAGE GENERATING PROGRAM

CROSS-REFERENCE TO RELATED APPLICATIONS

This application is based upon and claims the benefit of priority from Japanese Patent Application No. 2020-157877, filed on Sep. 18, 2020; the entire contents of which are incorporated herein by reference.

FIELD

Embodiments described herein relate generally to an image generating apparatus, an image generating method, and a non-volatile computer-readable storage medium storing therein an image generating program.

BACKGROUND

When generating a magnetic resonance image based on magnetic resonance data acquired through a non-Cartesian imaging process in a k-space, gridding is performed conventionally which is related to arranging acquisition points of the magnetic resonance data at grid points in the k-space. Normally, as for sensitivity of the gridding (hereinafter, "gridding sensitivity"), the Signal-to-Noise ratio (hereinafter, "S/N") in a central part of a reconstruction region is the highest. For this reason, a perimeter region of an image reconstructed through the gridding may have a degraded S/N value and exhibit artifacts such as shading and/or streak.

Further, when generating a magnetic resonance image, sensitivity encoding (hereinafter, "SENSE") may be performed in some situations in relation to a sensitivity correction for each of the reception coils, by using a sensitivity map of the reception coils acquired prior to a main scan performed on an examined subject.

At the time of generating a magnetic resonance image based on magnetic resonance data acquired through a non-Cartesian imaging process in a k-space, when the gridding and the SENSE scheme are used in combination, the reconstructed magnetic resonance image may exhibit artifacts and/or a degraded S/N value.

BRIEF DESCRIPTION OF THE DRAWINGS

FIG. 6 is a drawing illustrating examples of generated MR images and differences between the MR images and correct answer images, with respect to a result of the image generating process according to the first embodiment and a comparison example;

FIG. 7 is a drawing illustrating an outline of an image generating process according to a second embodiment; and FIG. 8 is a flowchart illustrating an example of a procedure in the image generating process according to the second embodiment.

DETAILED DESCRIPTION

Figure 1:
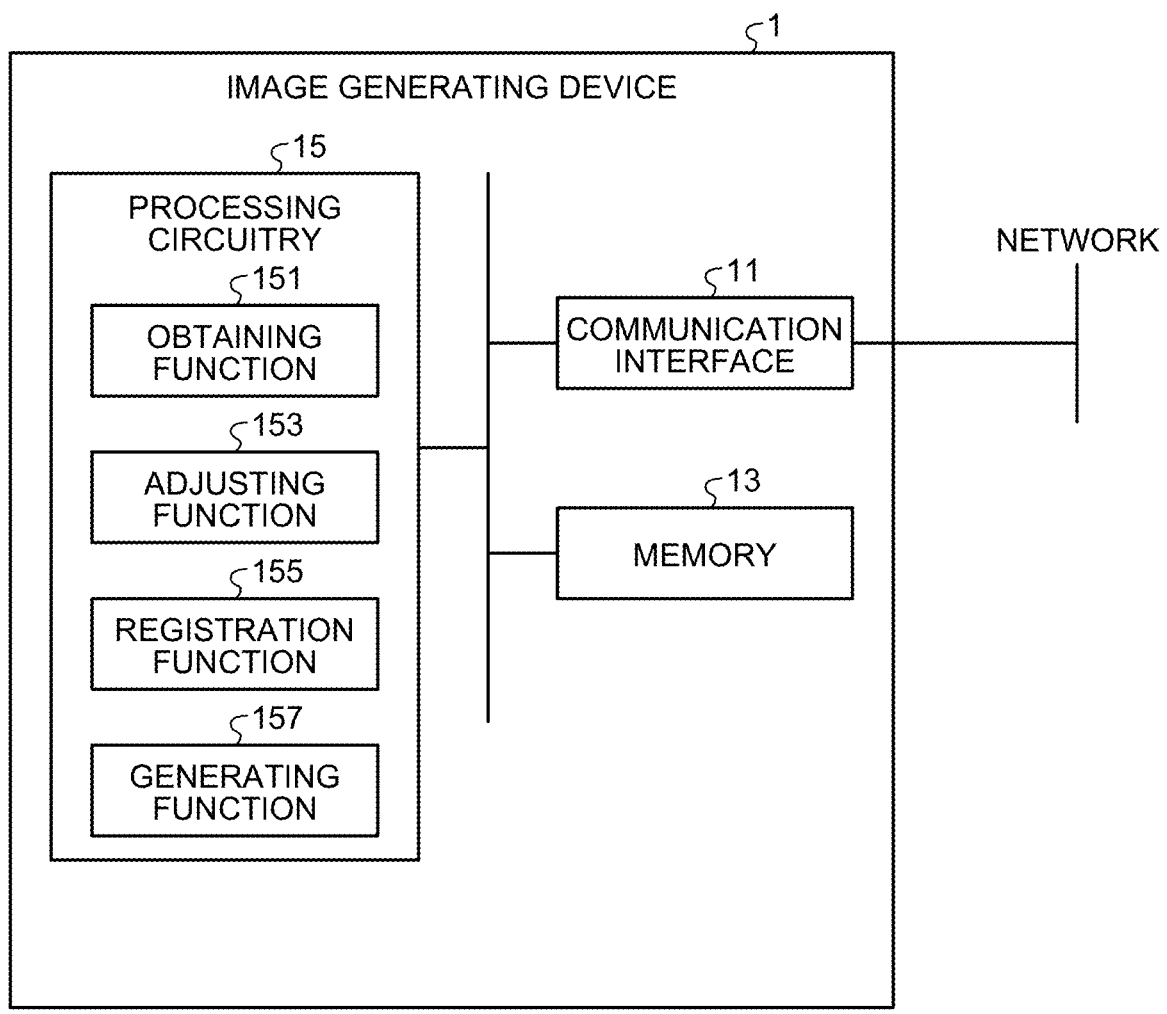
FIG. 1 is a block diagram illustrating an example of an image generating apparatus according to a first embodiment.

Exemplary embodiments of an image generating apparatus, an image generating method, and an image generating program will be explained in detail below, with reference to the accompanying drawings. FIG. 1 is a block diagram illustrating an example of an image generating apparatus 1. For example, the image generating apparatus 1 may be installed in any of various types of modalities equipped with various functions of the image generating apparatus 1 or in a server provided in a hospital or the like. The various functions of the image generating apparatus 1 may be installed in a server in a medical image management system (hereinafter, "Picture Archiving and Communication System [PACS]") or a server in a Hospital Information System (hereinafter, "HIS").

The image generating apparatus 1 described in the following embodiments includes processing circuitry 15. The processing circuitry 15 is configured to obtain a coil sensitivity distribution indicating a sensitivity distribution of a reception coil used for an imaging process performed on an examined subject (hereinafter "patient") and magnetic resonance data acquired from the imaging process that is non-Cartesian and performed in a k-space. On the basis of the coil sensitivity distribution, the processing circuitry 15 is configured to perform registration between the coil sensitivity distribution and a gridding sensitivity distribution indicating a distribution of gridding sensitivity related to arranging the magnetic resonance data in the k-space. The processing circuitry 15 is configured to generate a magnetic resonance image on the basis of a result of the registration, the magnetic resonance data, the coil sensitivity distribution, and the gridding sensitivity distribution.

Further, examples of the apparatuses equipped with the various functions of the image generating apparatus 1 include a Magnetic Resonance Imaging (MRI) apparatus, a Positron Emission Tomography (PET)-MRI apparatus, and a Single Photon Emission Computed Tomography (SPECT)-MRI apparatus. In the following sections, to explain a specific example, it is assumed that the image generating apparatus 1 is installed in an MRI apparatus. In that situation, it means that the MRI apparatus has various functions of the processing circuitry 15.

First Embodiment

Figure 2:
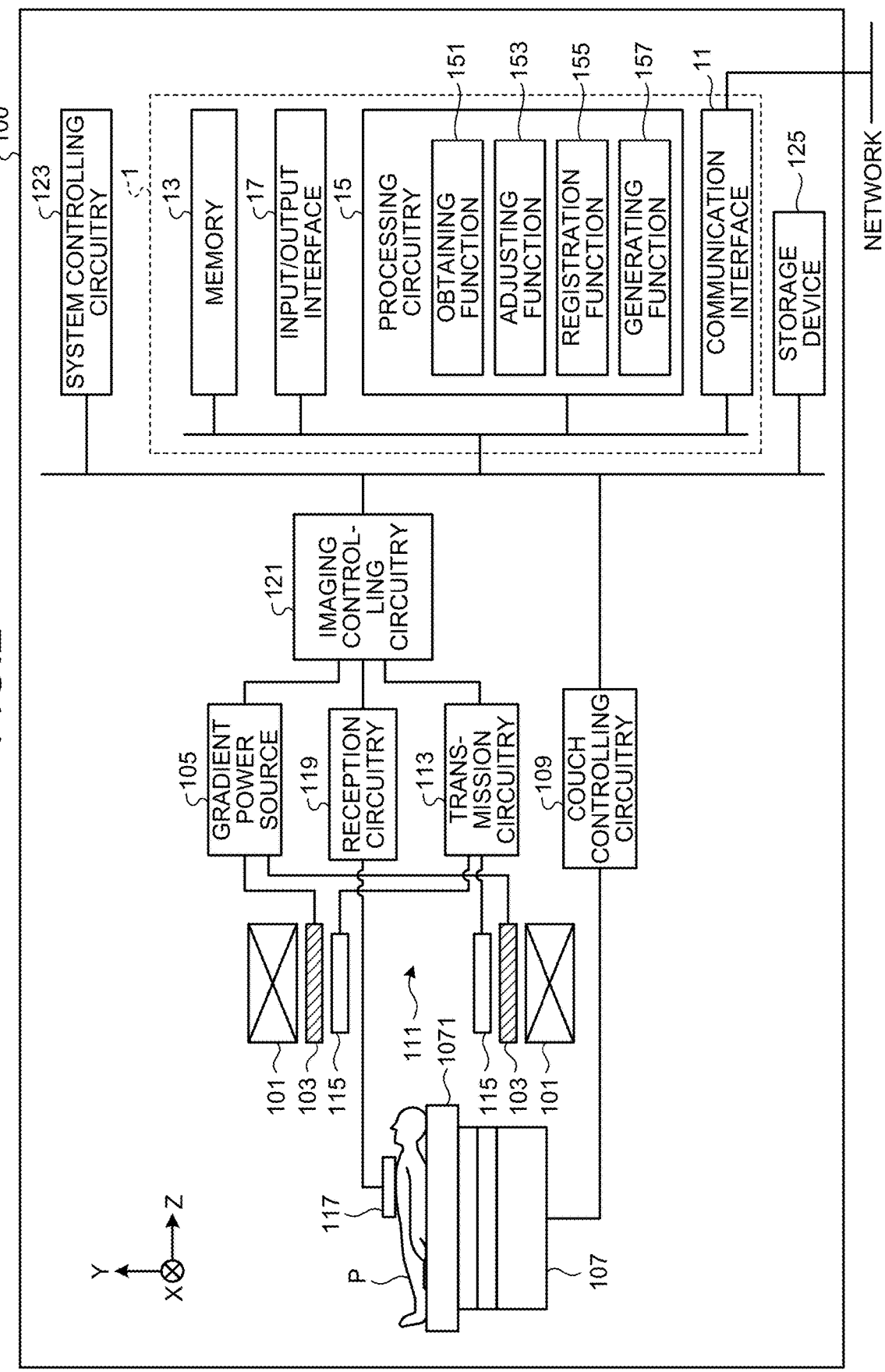
FIG. 2 is a diagram illustrating an example of a magnetic resonance imaging apparatus according to the first embodiment.

FIG. 2 is a diagram illustrating an example of an MRI apparatus 100 according to the present embodiment. As illustrated in FIG. 2, the image generating apparatus 1 provided in the MRI apparatus 100 further includes an input/output interface 17. However, as indicated in FIG. 1, the image generating apparatus 1 may not include the input/output interface 17. As illustrated in FIG. 2, the MRI apparatus 100 includes a static magnetic field magnet 101, a gradient coil 103, a gradient power source 105, a couch 107, couch controlling circuitry (a couch controlling unit) 109, transmission circuitry 113, a transmission coil 115, a reception coil 117, reception circuitry 119, imaging controlling circuitry (an acquiring unit) 121, system controlling circuitry (a system controlling unit) 123, a storage device 125, and the image generating apparatus 1.

The static magnetic field magnet 101 is a magnet formed to have a hollow and substantially circular cylindrical shape. The static magnetic field magnet 101 is configured to generate a substantially uniform static magnetic field in the space on the inside thereof. For example, a superconductive magnet or the like may be used as the static magnetic field magnet 101.

The gradient coil 103 is a coil formed to have a hollow and substantially circular cylindrical shape and is arranged on the inner surface side of a cooling container having a circular cylindrical shape. By individually receiving a supply of an electric current from the gradient power source 105, the gradient coil 103 is configured to generate gradient magnetic fields of each of which the magnetic field intensity changes along X-, Y-, and Z-axes that are orthogonal to one another. For example, the gradient magnetic fields generated by the gradient coil 103 along the X-, Y-, and Z-axes form a slice selecting gradient magnetic field, a phase encoding gradient magnetic field, and a frequency encoding gradient magnetic field (which may be called a readout gradient magnetic field). The slice selecting gradient magnetic field is used for arbitrarily determining an imaged cross-sectional plane. The phase encoding gradient magnetic field is used for changing the phase of a magnetic resonance signal (hereinafter, "MR signal") in accordance with a spatial position. The frequency encoding gradient magnetic field is used for changing the frequency of an MR signal in accordance with a spatial position.

The gradient power source 105 is a power source device configured to supply the electric currents to the gradient coil 103, under control of the imaging controlling circuitry 121.

The couch 107 is a device including a couchtop 1071 on which a patient P is placed. Under control of the couch controlling circuitry 109, the couch 107 is configured to insert the couchtop 1071 on which the patient P is placed, into a bore 111.

The couch controlling circuitry 109 is circuitry configured to control the couch 107. By driving the couch 107 according to an instruction from an operator received via the input/output interface 17, the couch controlling circuitry 109 moves the couchtop 1071 in longitudinal directions and up-and-down directions, as well as left-and-right directions in some situations.

The transmission circuitry 113 is configured to supply a radio frequency pulse modulated with a Larmor frequency to the transmission coil 115, under control of the imaging controlling circuitry 121. For example, the transmission circuitry 113 includes an oscillating unit, a phase selecting unit, a frequency converting unit, an amplitude modulating unit, a Radio Frequency (RF) amplifier, and the like. The oscillating unit is configured to generate an RF pulse having a resonance frequency unique to a target atomic nucleus positioned in the static magnetic field. The phase selecting unit is configured to select a phase of the RF pulse generated by the oscillating unit. The frequency converting unit is configured to convert the frequency of the RF pulse output from the phase selecting unit. The amplitude modulating unit is configured to modulate the amplitude of the RF pulse output from the frequency converting unit according to a sine mathematical function, for example. The RF amplifier is configured to amplify the RF pulse output from the amplitude modulating unit and to supply the amplified RF pulse to the transmission coil 115.

The transmission coil 115 is a Radio Frequency (RF) coil arranged on the inside of the gradient coil 103. The transmission coil 115 is configured to generate an RF pulse corresponding to a radio frequency magnetic field, in accordance with the output from the transmission circuitry 113.

The reception coil 117 is an RF coil arranged on the inside of the gradient coil 103. The reception coil 117 is configured to receive an MR signal emitted from the patient P due to the radio frequency magnetic field. The reception coil 117 is configured to output the received MR signal to the reception circuitry 119. For example, the reception coil 117 is a coil array including one or more, typically two or more, coil elements. In the following sections, to explain a specific example, the reception coil 117 is assumed to be a coil array including two or more coil elements.

Alternatively, the reception coil 117 may be structured with one coil element. Further, although FIG. 2 depicts the transmission coil 115 and the reception coil 117 as separate RF coils, the transmission coil 115 and the reception coil 117 may be implemented as an integrally-formed transmission/reception coil. The transmission/reception oil corresponds to an imaged site of the patient P and may be, for example, a local transmission/reception RF coil such as a head coil.

On the basis of the MR signal output from the reception coil 117, the reception circuitry 119 is configured to generate a digital MR signal (hereinafter, "MR data") under control of the imaging controlling circuitry 121. More specifically, the reception circuitry 119 generates the MR data by performing various types of signal processing processes on the MR signal output from the reception coil 117 and subsequently performing an Analog-to-Digital (A/D) conversion on the data resulting from the various types of signal processing processes. The reception circuitry 119 is configured to output the generated MR data to the imaging controlling circuitry 121. For example, the MR data is generated for each of the coil elements and is output to the imaging controlling circuitry 121 together with a tag identifying each coil element.

The imaging controlling circuitry 121 is configured to perform an imaging process on the patient P, by controlling the gradient power source 105, the transmission circuitry 113, the reception circuitry 119, and the like according to an imaging protocol output from the processing circuitry 15. The imaging protocol includes a pulse sequence corresponding to the type of the medical examination. The imaging protocol defines: the magnitude of the electric current to be supplied to the gradient coil 103 by the gradient power source 105; the timing with which the electric current is to be supplied to the gradient coil 103 by the gradient power source 105; the magnitude and the time width of the radio frequency pulse to be supplied to the transmission coil 115 by the transmission circuitry 113; the timing with which the radio frequency pulse is to be supplied to the transmission coil 115 by the transmission circuitry 113; the timing with which the MR signal is to be received by the reception coil 117; and the like. When having received the MR data from the reception circuitry 119 as a result of imaging the patient P by driving the gradient power source 105, the transmission circuitry 113, the reception circuitry 119, and the like, the imaging controlling circuitry 121 transfers the received MR data to the image generating apparatus 1 or the like.

For example, the imaging controlling circuitry 121 is configured to acquire MR data (hereinafter, "non-Cartesian data") by executing a pulse sequence related to a non-Cartesian imaging process in a k-space. The non-Cartesian imaging process may be, for example, a radial acquisition. In the following sections, to explain a specific example, the non-Cartesian imaging process is assumed to be a radial acquisition. Further, the imaging controlling circuitry 121 is configured to acquire MR data (hereinafter, "coil sensitivity data") related to generating a sensitivity distribution of the reception coil 117 (hereinafter, "coil sensitivity distribution") used for performing the imaging process on the patient P. The coil sensitivity distribution may be referred to as a coil sensitivity map and is expressed by using complex number data. For example, the acquisition of the coil sensitivity data is performed by the imaging controlling circuitry 121 through a pre-scan, a locator scan, or the like, prior to the acquisition of the non-Cartesian data. In that situation, for example, the coil sensitivity distribution is generated through a Fourier transform performed on the coil sensitivity data by a generating function 157 included in the processing circuitry 15. The imaging controlling circuitry 121 is realized by using a processor, for example.

The example is explained in which one or more "processors" read and execute programs corresponding to the functions from a memory 13; however, possible embodiments are not limited to this example. The term "processor" denotes, for example, a Central Processing Unit (CPU), a Graphics Processing Unit (GPU), or circuitry such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]).

When the processor is a CPU, for example, the processor realizes the functions by reading and executing the programs saved in the memory 13. In contrast, when the processor is an ASIC, the functions are directly incorporated in the circuitry of the processor as logic circuitry, instead of the programs being saved in the memory 13. Further, the processors according to the present embodiments do not each necessarily have to be structured as a single piece of circuitry. It is also acceptable to structure one processor by combining together a plurality of pieces of independent circuitry so as to realize the functions thereof. Further, although the example was explained in which the single piece of storage circuitry stores therein the programs corresponding to the processing functions, it is also acceptable to arrange a plurality of pieces of storage circuitry in a distributed manner, so that the processing circuitry reads a corresponding program from each of the individual pieces of storage circuitry.

As a hardware resource, the system controlling circuitry 123 includes a processor, memory elements such as a Read-Only Memory (ROM), a Random Access Memory (RAM), and/or the like (not illustrated) and is configured to control the MRI apparatus 100 by employing a system controlling function. More specifically, the system controlling circuitry 123 reads a system controlling program stored in the storage device 125, loads the read program into a memory, and controls pieces of circuitry of the MRI apparatus 100 according to the loaded system controlling program. For example, on the basis of an imaging condition input by the operator via the input/output interface 17, the system controlling circuitry 123 is configured to read the imaging protocol from the storage device 125. The system controlling circuitry 123 is configured to transmit the imaging protocol to the imaging controlling circuitry 121 so as to control the imaging process performed on the patient P. The system controlling circuitry 123 is realized by using a processor, for example. Alternatively, the system controlling circuitry 123 may be incorporated in the processing circuitry 15. In that situation, the system controlling function is executed by the processing circuitry 15, so that the processing circuitry 15 functions as a substitute for the system controlling circuitry 123.

The storage device 125 is configured to store therein various types of programs executed by the system controlling circuitry 123, various types of imaging protocols, imaging conditions including a plurality of imaging parameters that define the imaging protocols, and the like. For example, the storage device 125 may be a semiconductor memory element such as a RAM or a flash memory, or a Hard Disk Drive (HDD), a Solid State Drive (SSD), an optical disk, or the like. Alternatively, the storage device 125 may be a Compact Disc Read-Only Memory (CD-ROM) drive, a Digital Versatile Disc (DVD) drive, or a drive device configured to read and write various types of information to and from a portable storage medium such as a flash memory. Alternatively, the data stored in the storage device 125 may be stored in the memory 13. In that situation, the memory 13 functions as a substitute for the storage device 125.

The image generating apparatus 1 includes a communication interface 11, the memory 13, and the processing circuitry 15. As illustrated in FIGS. 1 and 2, in the image generating apparatus 1, the communication interface 11, the memory 13, and the processing circuitry 15 are electrically connected together by a bus. As illustrated in FIGS. 1 and 2, the image generating apparatus 1 is connected to a network via the communication interface 11. For example, the image generating apparatus 1 is connected to the network so as to be able to communicate with various types of modalities, the HIS, and an information processing system provided in the medical institution such as a Radiology Information System (RIS). Further, the image generating apparatus 1 illustrated in FIG. 1 may include an input interface used for inputting various types of information of a user and a display device (an output interface) used for displaying medical images generated by the generating function 157, as the input/output interface 17 illustrated in FIG. 2.

The communication interface 11 is configured to perform data communication, for example, with any of the various types of modalities that image the patient P during medical examinations performed on the patient P and with the HIS, the PACS, and/or the like. The standard used for the communication between the communication interface 11 and the various types of modalities and the hospital information system may be any standard. It is possible to use, for example, one or both of Health Level 7 (HL7) and a Digital Imaging and Communications in Medicine (DICOM).

The memory 13 is realized by using storage circuitry configured to store therein various types of information. For example, the memory 13 is a storage device such as an HDD, an SSD, or an integrated circuitry storage device. The memory 13 corresponds to a storage unit. Instead of being an HDD, an SSD, or the like, the memory 13 may be a semiconductor memory element such as a Random Access Memory (RAM) or a flash memory; an optical disc such as a Compact Disc (CD) or a Digital Versatile Disc (DVD); a portable storage medium; or a drive device that reads and writes various types of information to and from a semiconductor memory element such as a RAM.

The memory 13 is configured to store therein an obtaining function 151, an adjusting function 153, a registration function 155, and the generating function 157 realized by the processing circuitry 15 in the form of computer-executable programs. The memory 13 is configured to store therein various types of data received by the obtaining function 151 via the communication interface 11. More specifically, the memory 13 has stored therein, for example, a plurality of coil sensitivity distributions, the non-Cartesian data, and the gridding sensitivity distribution obtained by the obtaining function 151. Each of the coil sensitivity distributions corresponds to a different one of the plurality of coil elements. In other words, the memory 13 has stored therein the plurality of coil sensitivity distributions corresponding to the plurality of coil elements. Further, the memory 13 has stored therein a magnetic resonance image (hereinafter, "MR image") generated by the generating function 157.

The gridding sensitivity distribution is a distribution of the gridding sensitivity related to arranging the MR data in the k-space. The gridding corresponds to various types of processes used for interpolating the non-Cartesian data acquired through the non-Cartesian imaging process and arranging the result at grid points in the k-space. Conditions of the gridding correspond to requirements and restrictions or the like for realizing adjusting, changing, and revising various types of data and the like used in the various types of processes.

The gridding sensitivity distribution is expressed with complex number data. The gridding sensitivity distribution corresponds to a Fourier Transform of a kernel function used for convoluting the non-Cartesian data. In other words, the kernel function serves as a basis of the gridding sensitivity. As the kernel function, a gaussian function expressed with a complex number may be used, for example. Further, the kernel function does not necessarily have to be a Gaussian function and may be another type of mathematical function. Further, the kernel function may be stored in the memory 13. In the convolution calculation to convolute the non-Cartesian data by using the kernel function, the kernel function contributes to blurring the position of the non-Cartesian data in the k-space and values of the non-Cartesian data. Further, in the convolution calculation, the half-width of the kernel function corresponds to the degree of the blurring. Further, phase gradients of the kernel function correspond to positions in the gridding sensitivity distribution.

The processing circuitry 15 is configured to control the entirety of the image generating apparatus 1. The processing circuitry 15 is realized by using the abovementioned processor or the like. The processing circuitry 15 includes the obtaining function 151, the adjusting function 153, the registration function 155, and the generating function 157, or the like. The processing circuitry 15 realizing the obtaining function 151, the adjusting function 153, the registration function 155, and the generating function 157 correspond to an obtaining unit, an adjusting unit, a registration unit, and a generating unit, respectively. The functions such as the obtaining function 151, the adjusting function 153, the registration function 155, and the generating function 157 are stored in the memory 13, in the form of computer-executable programs. The processing circuitry 15 is a processor. For example, the processing circuitry 15 realizes the functions corresponding to the programs, by reading and executing the programs from the memory 13. In other words, the processing circuitry 15 that has read the programs has the functions such as the obtaining function 151, the adjusting function 153, the registration function 155, and the generating function 157.

By employing the obtaining function 151, the processing circuitry 15 is configured to obtain: one or more coil sensitivity distributions each indicating a distribution of the sensitivity of the reception coil 117 used for an imaging process performed on the patient P; and the MR data acquired from the imaging process that is non-Cartesian and performed on the patient P in the k-space. For example, as illustrated in FIG. 1, when the processing circuitry 15 is installed in the image generating apparatus 1 being a stand-alone device, the obtaining function 151 is configured to obtain: a plurality of coil sensitivity distributions corresponding to the plurality of coil elements from the PACS or a modality via the network and the communication interface 11; and the MR data from a radial acquisition via the network. In another example, when the processing circuitry 15 is installed in the MRI apparatus 100 as illustrated in FIG. 2, the obtaining function 151 is configured to obtain the plurality of coil sensitivity distributions generated by the generating function 157 and the MR data generated by the reception circuitry 119. Further, when the reception coil 117 includes a plurality of coil elements, the obtaining function 151 is configured to obtain the coil sensitivity distribution and the magnetic resonance data with respect to each of the plurality of coil elements. The obtaining function 151 is configured to store the obtained coil sensitivity distributions and the MR data into the memory 13.

By employing the adjusting function 153, the processing circuitry 15 is configured to adjust the gridding sensitivity distribution so that the gridding sensitivity distribution is optimal in accordance with the depth of the coil sensitivity distributions. In other words, on the basis of the coil sensitivity distributions, the adjusting function 153 adjusts either an envelope shape or the half-width of the kernel function serving as the basis of the gridding sensitivity distribution. More specifically, with respect to each of the plurality of coil elements of the reception coil 117, the adjusting function 153 is configured to adjust the kernel function corresponding to the coil element, on the basis of the coil sensitivity distribution corresponding to the coil element.

For example, the adjusting function 153 adjusts the half-width of the kernel function, by calculating a spread of sensitivity in the coil sensitivity distribution and comparing the calculated spread of sensitivity with a predetermined reference value. More specifically, to adjust the kernel function, the adjusting function 153 adjusts, with respect to each of the plurality of coil elements (i.e., each of a plurality of acquisition channels), the half-width of the kernel function by using an index indicating the spread of sensitivity in the coil sensitivity distribution. In this situation, each of the acquisition channels does not necessarily have to correspond to one coil element and may correspond to two or more coil elements. The predetermined reference value of which there are more than one and specific details of processes performed by the adjusting function 153 will be explained in the description of image generating processes. Further, the adjusting function 153 does not necessarily have to be included in the processing circuitry 15. When not included, the adjusting function 153 illustrated in FIGS. 1 and 2 is omitted, and the kernel function used in the gridding has mutually the same shape among the plurality of coil elements.

By employing the registration function 155, the processing circuitry 15 is configured to perform registration between the gridding sensitivity distribution and a coil sensitivity distribution on the basis of the coil sensitivity distribution. Further, when the reception coil 117 includes a plurality of coil elements, the registration function 155 is configured to perform the registration between the gridding sensitivity distribution and the coil sensitivity distributions, on the basis of the coil sensitivity distributions. For example, the registration function 155 performs the registration between the center of gravity of the sensitivity in the gridding sensitivity distribution (hereinafter, "gridding sensitivity center-of-gravity") and the center of gravity of the sensitivity in the coil sensitivity distribution (hereinafter, "coil sensitivity center-of-gravity").

As a result of the registration, the registration function 155 calculates the difference between the gridding sensitivity center-of-gravity and the coil sensitivity center-of-gravity. The difference corresponds, for example, to a vector (the distance and the direction) extending from the coil sensitivity center-of-gravity to the gridding sensitivity center-of-gravity. In other words, the calculation of the vector corresponds to a result of the registration between the gridding sensitivity distribution and the coil sensitivity distribution. With respect to each of the plurality of coil elements of the reception coil 117, the registration function 155 is configured to perform the registration. Specific processes performed by the registration function 155 will be explained in the description of processes (hereinafter, "image generating processes") to generate the MR image by using the non-Cartesian data.

By employing the generating function 157, the processing circuitry 15 is configured to generate the MR image on the basis of the result of the registration performed by the registration function 155, the non-Cartesian data being the MR data, the coil sensitivity distributions, and the gridding sensitivity distribution. In the example in which the adjusting function 153 has adjusted the kernel function, the gridding sensitivity distribution used by the generating function 157 corresponds to a Fourier transform of the kernel function adjusted by the adjusting function 153. In that situation, the generating function 157 is configured to generate the MR image on the basis of the result of the registration, the magnetic resonance data, the coil sensitivity distribution, and the gridding sensitivity distribution corresponding to the adjusted kernel function. When the reception coil 117 includes a plurality of coil elements, the generating function 157 is configured to generate the MR image on the basis of results of a plurality of registration processes, a plurality of pieces of non-Cartesian data, a plurality of coil sensitivity distributions, and a plurality of gridding sensitivity distributions, each corresponding to a different one of the plurality of coil elements.

For example, by employing the generating function 157, the processing circuitry 15 performs a phase modulation on the non-Cartesian data, by using, as the result of the registration, the difference (the vector) between the gridding sensitivity center-of-gravity and the coil sensitivity center-of-gravity. In other words, as the phase modulation, the generating function 157 performs a phase modulation by applying a gradient (a slope) of the phase corresponding to the vector to a phase in the non-Cartesian data. The phase modulation on the non-Cartesian data is included in changing a gridding condition. Subsequently, by using the kernel function serving as a basis of the gridding sensitivity, the generating function 157 arranges the non-Cartesian data after the phase modulation (hereinafter, "phase-modulated data") in the k-space. More specifically, the generating function 157 performs a convolution calculation to convolute the phase-modulated data by using the kernel function and further arranges the result of the convolution calculation in the k-space.

By employing the generating function 157, the processing circuitry 15 is configured to generate the MR image by using the MR data arranged in the k-space. More specifically, the generating function 157 performs a Fourier transform on the result of the convolution calculation arranged in the k-space. The generating function 157 generates a conversion image by performing parallel displacement on the result of the Fourier transform so as to correspond to the phase opposite to the phase modulation, on the basis of the difference. In an example, the generating function 157 may generate the conversion image by modulating the non-Cartesian data arranged in the k-space into the phase opposite to the phase modulation on the basis of the difference and further performing a Fourier transform on the non-Cartesian data modulated into the opposite phase.

By employing the generating function 157, the processing circuitry 15 is configured to generate the MR image by using the conversion image. More specifically, by employing the generating function 157, the processing circuitry 15 generates a combined sensitivity distribution by combining the gridding sensitivity distribution with the coil sensitivity distribution, while using the result of the registration. The combined sensitivity distribution is expressed by using complex number data. More specifically, the generating function 157 performs parallel displacement on the gridding sensitivity distribution, by using a vector (hereinafter, "inverse vector") being opposite to the abovementioned vector. Subsequently, the generating function 157 generates the combined sensitivity distribution by combining the gridding sensitivity distribution resulting from the parallel displacement with the coil sensitivity distribution. After that, the generating function 157 generates the MR image by performing a SENSitivity Encoding (hereinafter "SENSE") process while using the conversion image and the combined sensitivity distribution. Alternatively, the generating function 157 may generate the MR image by calculating the square root of a Sum of Squares (SOS) of the conversion image.

In an example, by employing the generating function 157, the processing circuitry 15 may generate a de-shaded image by reducing (correcting) shading in the conversion image, by dividing the conversion image by the gridding sensitivity distribution. In that situation, the generating function 157 generates the MR image, by performing a SENSE process while using the de-shaded image and the coil sensitivity distribution or calculating an SOS Of the de-shaded image. Specific processes performed by the generating function 157 will be explained in the description of the image generating processes.

Figure 3:
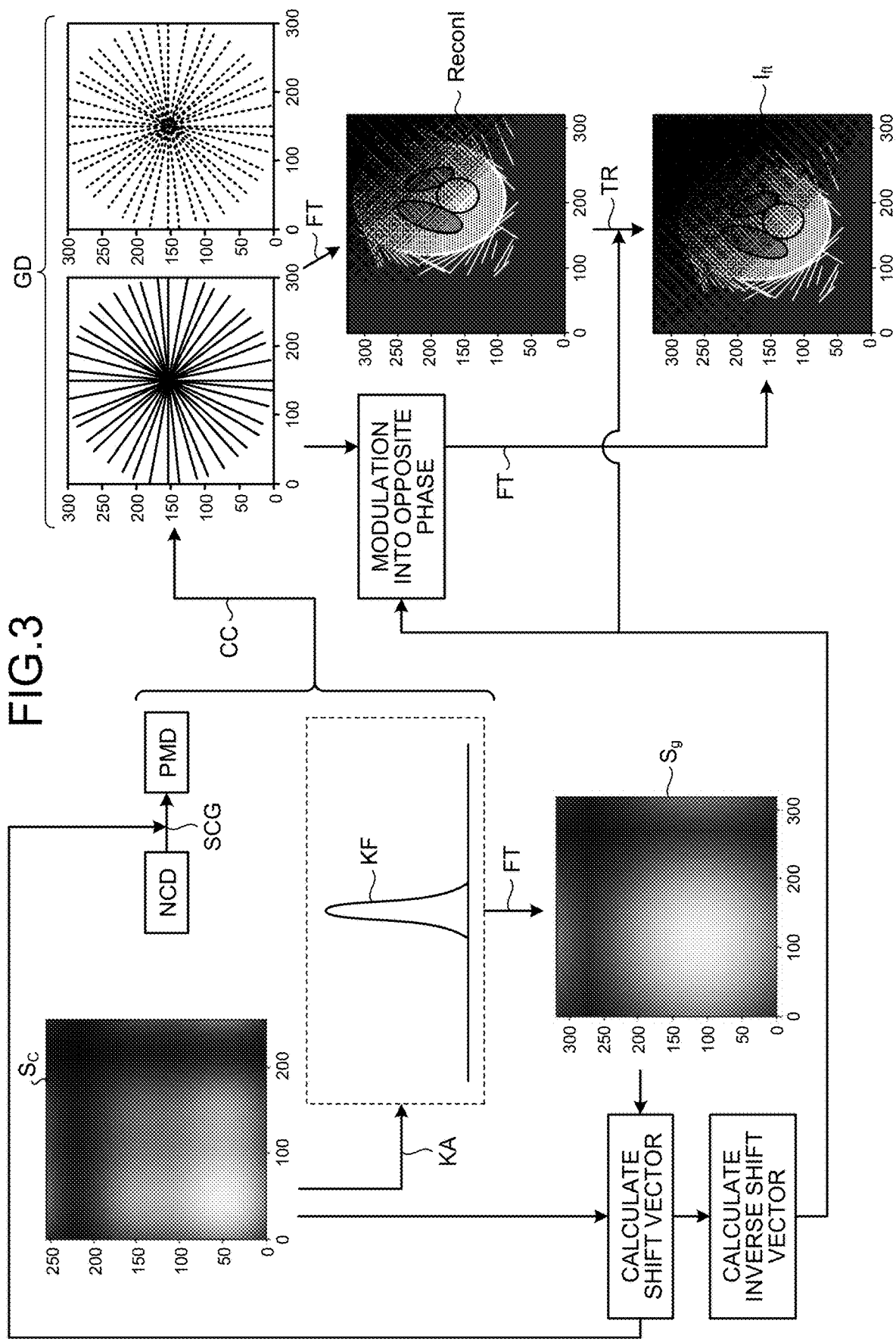
FIG. 3 is a drawing illustrating an outline of an image generating process according to the first embodiment.
Figure 4:
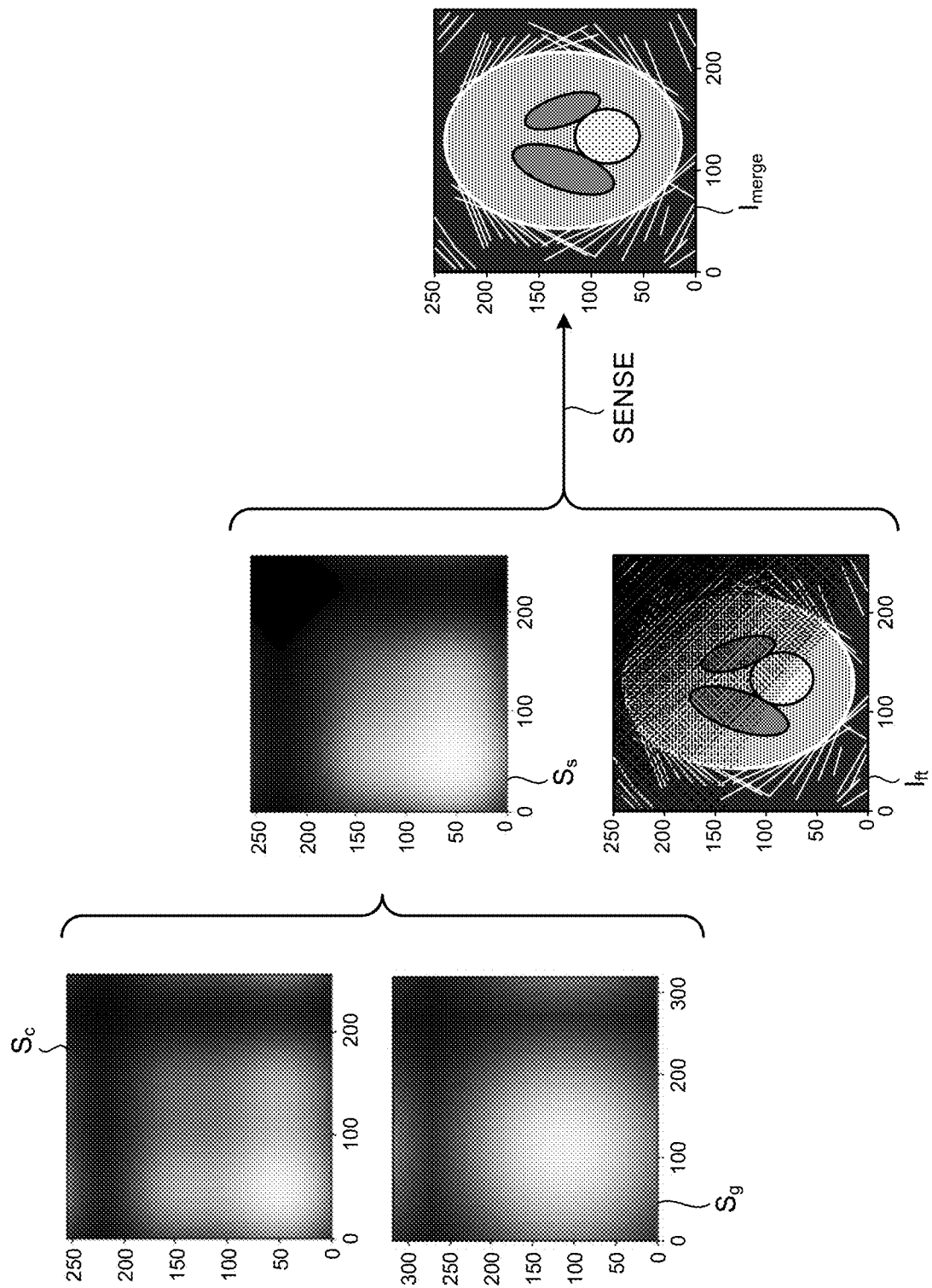
FIG. 4 is another drawing illustrating the outline of the image generating process according to the first embodiment.
Figure 5:
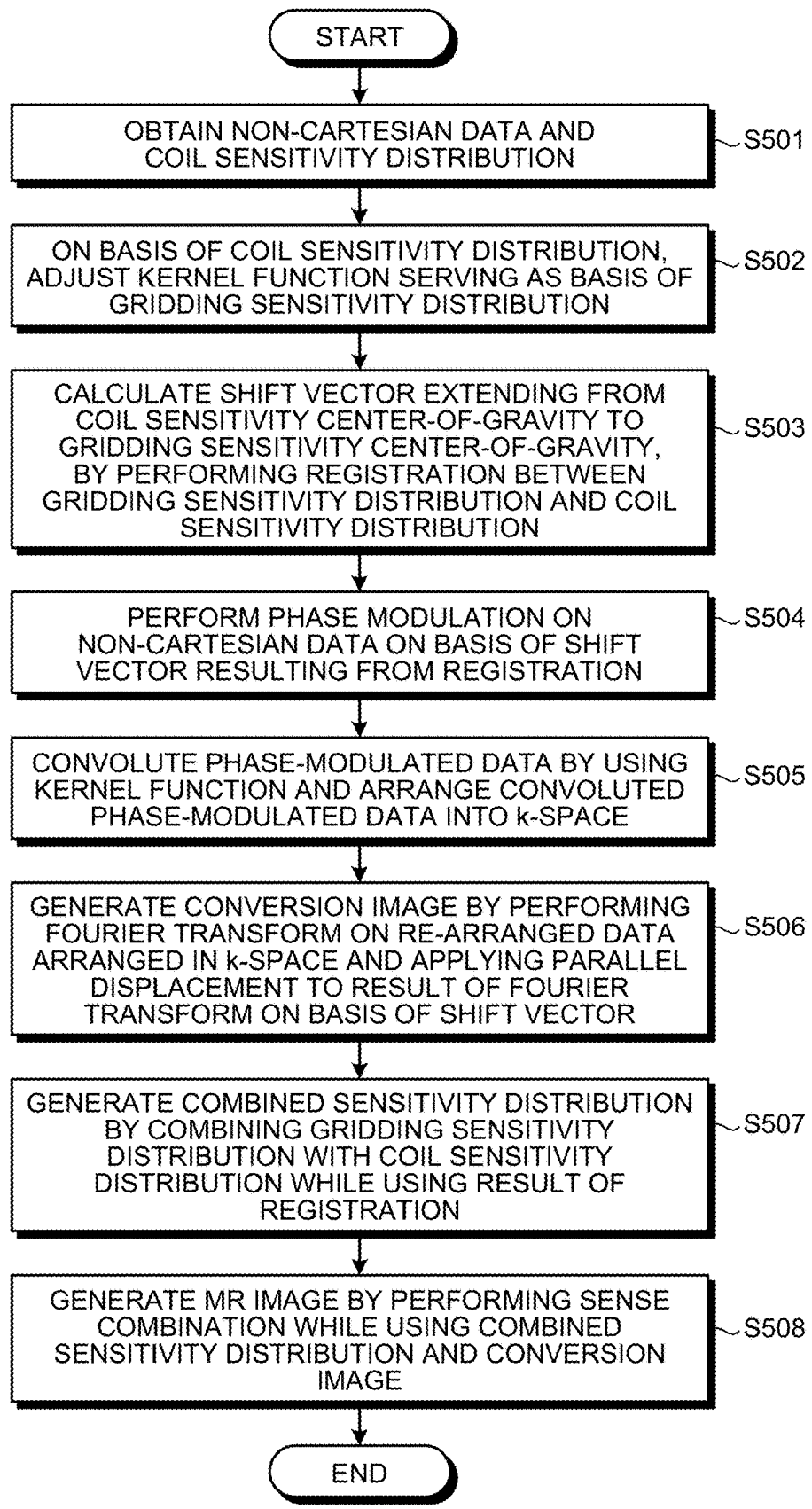
FIG. 5 is a flowchart illustrating an example of a procedure in the image generating process according to the first embodiment.

Image generating processes performed by the MRI apparatus 100 according to the present embodiment structured as described above will be explained, with reference to FIGS. 3 to 5. FIGS. 3 and 4 are drawings illustrating an outline of an image generating process. FIG. 5 is a flowchart illustrating an example of a procedure in the image generating process. The image generating process is also applicable, as appropriate, to reconstruction related to Parallel imaging schemes.

At a preliminary stage of the image generating process in FIG. 5, the imaging controlling circuitry 121 performs a coil sensitivity data acquiring process on the patient P. By employing the generating function 157, the processing circuitry 15 generates a coil sensitivity distribution $S_c$ by performing a Fourier transform on the coil sensitivity data. Further, the imaging controlling circuitry 121 acquires non-Cartesian data NCD by performing a non-Cartesian imaging process on the patient P. The coil sensitivity distribution $S_c$ and the non-Cartesian data NCD are stored in the storage device 125, the PACS, and/or the like.

Step S501:

By employing the obtaining function 151, the processing circuitry 15 obtains the non-Cartesian data NCD and the coil sensitivity distribution $S_c$. For example, the obtaining function 151 obtains the non-Cartesian data NCD and the coil sensitivity distribution $S_c$ from the memory 13. When the image generating apparatus 1 is used alone, the obtaining function 151 obtains the non-Cartesian data NCD and the coil sensitivity distribution $S_c$ from an external storage device, the PACS, or the like, via the network and the communication interface 11. The obtaining function 151 stores the obtained non-Cartesian data NCD and coil sensitivity distribution $S_c$, into the memory 13.

Step S502:

By employing the adjusting function 153, the processing circuitry 15 adjusts (kernel adjustment: KA) the kernel function serving as a basis of the gridding sensitivity distribution, on the basis of the coil sensitivity distribution $S_c$. More specifically, by using the index indicating the spread of sensitivity in the coil sensitivity distribution $S_c$, the adjusting function 153 adjusts the half-width of the kernel function. For example, the index corresponds to the degree of the spread of sensitivity in the coil sensitivity distribution. More specifically, with respect to each coil sensitivity distribution $S_c$ corresponding to a coil element c, the adjusting function 153 calculates the index by using the expressions presented below, for example.

$$dev(x)_c = \sqrt{\frac{\int |x - avg(x)_c|^2 |S_c(\vec{r})| d\vec{r}}{\int |S_c(\vec{r})| d\vec{r}}}, \quad (1)$$

$$dev(y)_c = \sqrt{\frac{\int |y - avg(y)_c|^2 |S_c(\vec{r})| d\vec{r}}{\int |S_c(\vec{r})| d\vec{r}}}$$

In Expression (1) above, $dev(x)_c$ and $dev(y)_c$ correspond to the index of an x component and the index of a y component, respectively, in the vector presented below expressing a position in the image of the coil sensitivity distribution $S_c$.

$$\vec{r} = \begin{pmatrix} x \\ y \end{pmatrix}$$

The right hand side of Expression (1) expresses a value obtained by normalizing a sensitivity standard deviation that is weighted with the sensitivity in the x direction and the y direction and that uses the coil sensitivity center-of-gravity presented below as a reference, with the integral of the sensitivity in the coil sensitivity distribution $S_c$.

$$avg(\vec{r})_c = \begin{pmatrix} avg(x)_c \\ avg(y)_c \end{pmatrix}$$

It is possible to calculate the coil sensitivity center-of-gravity of the coil element c by using Expression (2) presented below:

$$avg(\vec{r})_c = \frac{\int \vec{r} |S_c(\vec{r})| d\vec{r}}{\int |S_c(\vec{r})| d\vec{r}} \quad (2)$$

The left hand side of Expression (2) expresses a position vector of the coil sensitivity center-of-gravity. The denominator on the right hand side expresses integrating coil sensitivity $S_c(r)$ in a position r within the coil sensitivity distribution $S_c$, over the entire area of the coil sensitivity distribution $S_c$. The numerator on the right hand side expresses multiplying the position r with the weight $S_c(r)$ being the coil sensitivity in the position r within the coil sensitivity distribution $S_c$ and integrating the result over the entire area of the coil sensitivity distribution $S_c$.

When the pre-adjustment kernel function (hereinafter, "reference kernel function") for a prescribed reference value $dev_{ref}$ is expressed as $K_{ref}(kx, ky)$, the processing circuitry 15 determines, by employing the generating function 157, a post-adjustment kernel function with respect to the coil element c, on the basis of the calculated indices ($dev(x)_c$ and $dev(y)_c$), the prescribed reference value $dev_{ref}$, and the reference kernel function $K_{ref}(kx, ky)$, by using the expression presented below.

$$K_c(k_x, k_y) = e^{-i(\vec{k} \cdot (-avg(\vec{r})))} \cdot \frac{dev_{ref}}{dev(x)_c} \frac{dev_{ref}}{dev(y)_c} K_{ref}\left(\frac{dev(x)_c}{dev_{ref}} k_x, \frac{dev(y)_c}{dev_{ref}} k_y\right) \quad (3)$$

On the right hand side of Expression (3), the exponent of a Napier's constant "e" denotes a change in the phase from the pre-adjustment kernel function. Further, on the right hand side of Expression (3), the multiplier of the exponential function of the Napier's constant "e" corresponds to a change in the envelope shape of the pre-adjustment kernel function, i.e., an adjustment to the half-width of the kernel function. The prescribed reference value $dev_{ref}$ denotes, for example, a length (the distance from the center of the image to an edge part of the image) half as long as the image size of the coil sensitivity distribution $S_c$. Because the weighted standard deviations ($dev(x)_c$ and $dev(y)_c$) calculated from the coil sensitivity distribution $S_c$ never exceeds the half of the image size, the shape of the post-adjustment kernel function KF expressed in Expression (3) is a shape obtained by stretching the reference kernel function $K_{ref}$ stored in the memory 13 in advance.

By employing the adjusting function 153, the processing circuitry 15 generates a post-adjustment gridding sensitivity distribution $S_g$ corresponding to the coil element c, by performing a Fourier transform on the post-adjustment kernel function KF. Thus, the adjustment of the kernel function with respect to the gridding sensitivity distribution $S_g$ is completed. The adjusting function 153 stores, into the memory 13, the kernel function KF adjusted in accordance with the coil sensitivity distribution $S_c$ corresponding to the coil element c and the post-adjustment gridding sensitivity distribution $S_g$, so as to be kept in correspondence with the coil element c. The adjustment of the kernel function at the present step is included in changing a gridding condition. The gridding sensitivity distribution and the kernel function used in the following processes are assumed to be those that have been adjusted at the present step.

In another example, when the processing circuitry 15 does not include the adjusting function 153, the present step shall be omitted. In that situation, the memory 13 stores therein a kernel function and a gridding sensitivity distribution that are common to all the coil elements.

Step S503:

By employing the registration function 155, the processing circuitry 15 performs registration between the gridding sensitivity distribution $S_g$ and the coil sensitivity distribution $S_c$. By performing the registration between the gridding sensitivity distribution $S_g$ and the coil sensitivity distribution $S_c$, the registration function 155 calculates, for example, a vector (hereinafter, "shift vector") extending from the coil sensitivity center-of-gravity to the gridding sensitivity center-of-gravity.

In the following sections, to make the explanation simple, it is assumed that the gridding sensitivity center-of-gravity is the center of the image, while the origin of the image is at the center of the image. In that situation, the shift vector is an inverse vector of the position vector of the coil sensitivity center-of-gravity. In other words, the shift vector is a vector obtained by attaching the negative sign to the position vector of the coil sensitivity center-of-gravity presented in Expression (2).

Step S504:

By employing the generating function 157, the processing circuitry 15 performs a phase modulation (a shift operation: SCG) on the non-Cartesian data NCD, on the basis of the shift vector resulting from the registration. The shifting of the image using the shift vector in the image space corresponds, in the k-space, to complex modulation, i.e., applying a phase gradient that uses the shift vector as the gradient.

Accordingly, the generating function 157 multiplies the non-Cartesian data NCD with the gradient of the phase presented below based on the shift vector resulting from the registration.

$$e^{-i(\vec{k}\cdot(-avg(\vec{r})))}$$

As a result, the generating function 157 generates phase-modulated data PMD. The process at the present step of performing the phase modulation on the non-Cartesian data NCD, which is the MR data subject to the reconstruction, corresponds to changing the gridding condition on the basis of the sensitivity information of the reception coil 117 corresponding to the coil sensitivity distribution $S_c$.

Step S505:

By employing the generating function 157, the processing circuitry 15 re-arranges the phase-modulated data PMD in a Cartesian coordinate system of the k-space, by performing a convolution calculation CC to convolute the phase-modulated non-Cartesian data, i.e., the phase-modulated data PMD, while using the kernel function KF. The symbol "GD" in FIG. 3 indicates the phase-modulated data PMD rearranged in the Cartesian coordinate system of the k-space. As illustrated in FIG. 3, the re-arranged data GD indicating the result of the convolution calculation CC arranged in the k-space is represented by two types of k-space data corresponding to an absolute value and a phase, i.e., a complex number. The re-arranged data GD has a predetermined width corresponding to the half-width with respect to an argument direction perpendicular to the radial direction and the radial direction, as a result of the convolution calculation CC using the kernel function KF, i.e., blurring corresponding to the half-width of the kernel function KF, or the like.

Step S506:

By employing the generating function 157, the processing circuitry 15 performs a Fourier transform FT on the re-arranged data GD arranged in the k-space. As a result, a reconstruction image ReconI illustrated in FIG. 3 is generated. As illustrated in FIG. 3, the reconstruction image ReconI exhibits a phenomenon called shading where a perimeter part of the image region of the cross-sectional image is darkened. The generating function 157 performs parallel displacement TR on the reconstruction image ReconI resulting from the Fourier transform on the re-arranged data GD, i.e., the magnetic resonance data arranged in the k-space, so as to correspond to the phase opposite to the phase modulation performed at step S504, on the basis of the difference calculated by the registration function 155, i.e., the shift vector. Thus, the generating function 157 generates a conversion image $I_{ft}$.

More specifically, the generating function 157 generates the conversion image $I_{ft}$, by performing the parallel displacement TR on the reconstruction image ReconI, by using Expression (2) expressing the position vector of the coil sensitivity center-of-gravity, i.e., an inverse vector of the shift vector (hereinafter, "inverse shift vector").

The generation of the conversion image $I_{ft}$ is not limited to the procedure described above. For instance, the generating function 157 may modulate the re-arranged data GD arranged in the k-space into the phase opposite to the phase modulation performed at step S504. For example, the opposite phase is expressed by using the inverse shift vector of the shift vector as a phase gradient, in the exponent of the Napier's constant "e". More specifically, the opposite phase can be expressed with the expression presented below:

$$e^{-i(\vec{k}\cdot avg(\vec{r})))}$$

The generating function 157 further multiplies the phase in the above expression by the re-arranged data GD arranged in the k-space. This multiplication corresponds, in the image space, to parallel displacement using the inverse shift vector, on the basis of a formula of a Fourier transform. The generating function 157 generates the conversion image $I_{ft}$, by performing the Fourier transform FT on the re-arranged data GD that has been modulated into the opposite phase.

Step S507:

By employing the generating function 157, the processing circuitry 15 generates a combined sensitivity distribution $S_s$, by combining the gridding sensitivity distribution $S_g$ with the coil sensitivity distribution $S_c$, while using the result of the registration. More specifically, the gridding sensitivity distribution $S_g$ is combined with the coil sensitivity distribution $S_c$, by performing the registration between the gridding sensitivity center-of-gravity and the coil sensitivity center-of-gravity. The combining process is performed on each of the coil elements. For example, the combining process is, as indicated in the expression presented below, a product of the gridding sensitivity distribution $S_g$ and the coil sensitivity distribution $S_c$ with respect to each pixel.

$$S_{sc}(r)=S_{gc}(r)\cdot S_{cc}(r)$$

In the above expression, $S_{sc}(r)$ denotes the combined sensitivity distribution $S_s$ in the position r with respect to the coil element c. $S_{gc}(r)$ denotes the gridding sensitivity in the position r with respect to the coil element c. $S_{cc}(r)$ denotes the sensitivity of the coil element c in the position r.

It is possible to perform the process at the present step at any stage later than step S504. The processes at steps S501 through S507 are performed on each of the plurality of coil elements.

Step S508

By employing the generating function 157, the processing circuitry 15 generates an MR image $I_{merge}$, by performing a combining process using a SENSE scheme (hereinafter, "SENSE combination") while using the combined sensitivity distribution $S_s$ and the conversion image $I_{ft}$. The process of generating the combined sensitivity distribution $S_s$ has been performed on each of the plurality of coil elements. Accordingly, the SENSE combination uses a plurality of combined sensitivity distributions $S_{sc}$ and a plurality of conversion images $I_{ft}$ corresponding to the plurality of coil elements. As illustrated in FIG. 4, when the region (hereinafter, "image region") representing the conversion image $I_{ft}$ is larger than the region (hereinafter, "combined sensitivity region") representing the combined sensitivity distribution $S_s$, the generating function 157 performs, prior to the SENSE combination, a cropping process on the conversion image $I_{ft}$ and the combined sensitivity distribution $S_s$, so that the region of the conversion image $I_{ft}$ and the combined sensitivity region fit an image region designated by the user via the input/output interface 17.

For example, it is possible to realize the SENSE combination by using Expression (4) presented below.

$$I_{merge}(r) = \frac{\sum_c S_{sc}^*(r) \cdot I_{ftc}(r)}{\sum_c S_{sc}^*(r) \cdot S_{sc}(r)} \quad (4)$$

The left hand side of Expression (4), $I_{merge}(r)$, denotes a pixel value of the MR image $I_{merge}$ generated by the generating function 157 in the position r within the image. On the right hand side of Expression (4), $S_{sc}(r)$ denotes combined sensitivity in the combined sensitivity distribution $S_s$ in the position r with respect to the coil element c. The symbol * denotes a complex conjugate.

Further, on the right hand side of Expression (4), $I_{ftc}(r)$ denotes a pixel value of the conversion image $I_{ft}$ in the position r with respect to the coil element c. The denominator on the right hand side of Expression (4) denotes a value obtained by adding together, with respect to all the coil elements, the square of the absolute value of the combined sensitivity distribution $S_{sc}$ of each of the coil elements in the position r. Further, the numerator on the right hand side of Expression (4) denotes a value obtained by adding together, with respect to all the coil elements, the product of the conversion image $I_{ft}$ and the combined sensitivity distribution $S_{sc}$ of each of the coil elements in the position r, which denotes a weighted addition of the combined sensitivity distributions $S_{sc}$ corresponding to the conversion image $I_{ft}$ in the position r, with respect to all the coil elements. In other words, Expression (4) indicates that the value obtained by normalizing the weighted addition with the combined sensitivity is calculated as the MR image $I_{merge}$.

In a modification example of the present embodiment, at the present step S508, the processing circuitry 15 may generate, by employing the generating function 157, the MR image $I_{merge}$ by calculating an SOS while using the pixel value $I_{ftc}(r)$ of the conversion image $I_{ft}$ in the position r with respect to the coil element, without using the combined sensitivity distribution $S_s$. In this situation, step S507 is unnecessary. The generation of the MR image $I_{merge}$ using the SOS is realized by using the expression presented below.

$$I_{merge}(r) = \sqrt{\sum_c I_{ftc}^*(r) \cdot I_{ftc}(r)}$$

As indicated in the above expression, when the SOS is used, the MR image $I_{merge}$ is generated without using the combined sensitivity distribution $S_s$, i.e., the gridding sensitivity distribution $S_g$ and the coil sensitivity distribution $S_c$.

In a further modified example of the present modification example, it is also acceptable to use a de-shaded image obtained by dividing the pixel value $I_{ftc}(r)$ by the pixel value $S_{gc}(r)$ of the gridding sensitivity distribution $S_g$ in the position r with respect to the coil element c, in place of the pixel value $I_{ftc}(r)$ used in the calculation of the SOS. The generating function 157 calculates a de-shaded image $I_{dc}(r)$ with respect to the coil element c by using the expression presented below.

$$I_{dc}(r) = \frac{1}{S_{gc}(r)} I_{ftc}(r)$$

In this situation, the generating function 157 generates an MR image $I_{merge}$ by calculating the SOS while using the calculated de-shaded image $I_{dc}(r)$.

When the adjusting function 153 does not adjust the kernel function related to the gridding sensitivity distribution $S_g$, the gridding sensitivity distribution $S_g$ is a constant that is not dependent on the coil element ($S_{gc}(r)=S_g(r)$). In that situation, the MR image $I_{merge}$ generated by the SENSE combination using the combined sensitivity distribution $S_s$ is equivalent to the MR image $I_{dcmerge}$ generated by the SENSE combination using the de-shaded image $I_{dc}(r)$ and the coil sensitivity distribution $S_{cc}$, as indicated in the expression presented below.

$$I_{merge}(r) = \frac{\sum_c S_{sc}^*(r) \cdot I_{ftc}(r)}{\sum_c S_{sc}^*(r) \cdot S_{sc}(r)} = \frac{\sum_c [S_{gc}(r) \cdot S_{cc}(r)]^* \cdot I_{ftc}(r)}{\sum_c [S_{gc}(r) \cdot S_{cc}(r)]^* \cdot [S_{gc}(r) \cdot S_{cc}(r)]} =$$

$$\frac{\sum_c [S_g(r) \cdot S_{cc}(r)]^* \cdot I_{ftc}(r)}{\sum_c [S_g(r) \cdot S_{cc}(r)]^* \cdot [S_g(r) \cdot S_{cc}(r)]} = \frac{S_g^*(r) \sum_c S_{cc}^*(r) \cdot I_{ftc}(r)}{S_g^*(r) \cdot S_g(r) \sum_c S_{cc}^*(r) \cdot S_{cc}(r)} =$$

$$\frac{\sum_c S_{cc}^*(r) \cdot I_{ftc}(r)/S_g(r)}{\sum_c S_{cc}^*(r) \cdot S_{cc}(r)} = \frac{\sum_c S_{cc}^*(r) \cdot I_{dc}(r)}{\sum_c S_{cc}^*(r) \cdot S_{cc}(r)} = I_{dcmerge}(r)$$

Accordingly, when the SENSE combination is implemented without the adjusting function 153 adjusting the kernel function related to the gridding sensitivity distribution $S_g$, the MR image $I_{dcmerge}$ having the same quality as that of the MR image $I_{merge}$ is generated regardless of whether the combined sensitivity distribution $S_s$ is used or not.

When the MRI apparatus 100 and the image generating apparatus 1 according to the first embodiment described above are used, the coil sensitivity distribution $S_c$ and the non-Cartesian data NCD are obtained, so as to perform the registration between the gridding sensitivity distribution $S_g$ and the coil sensitivity distribution $S_c$ on the basis of the coil sensitivity distribution $S_c$, so that the MR image $I_{merge}$ is generated on the basis of the result of the registration, the non-Cartesian data NCD, the coil sensitivity distribution $S_c$, and the gridding sensitivity distribution $S_g$. More specifically, when the MRI apparatus 100 and the image generating apparatus 1 described herein are used, the phase modulation is performed on the non-Cartesian data NCD by using the shift vector corresponding to the difference between the gridding sensitivity center-of-gravity and the coil sensitivity center-of-gravity, so that the phase-modulated magnetic resonance data is arranged in the k-space by using the kernel function KF serving as the basis of the gridding sensitivity, so that the MR image $I_{merge}$ is generated by using the magnetic resonance data arranged in the k-space (the re-arranged data GD).

Further, when the MRI apparatus 100 and the image generating apparatus 1 described herein are used, the conversion image $I_{ft}$ is generated, by performing the parallel displacement TR on the reconstruction image ReconI resulting from the Fourier transform performed on the magnetic resonance data arranged in the k-space (the re-arranged data GD), so as to correspond to the phase opposite to the phase modulation on the basis of the difference between the coil sensitivity center-of-gravity and the gridding sensitivity center-of-gravity. Further, the MR image $I_{merge}$ is generated by using the conversion image $I_{ft}$. In another example, when the MRI apparatus 100 and the image generating apparatus 1 described herein are used, the conversion image Ift is generated by modulating the magnetic resonance data arranged in the k-space (the re-arranged data GD) into the phase opposite to the phase modulation on the basis of the difference and further performing the Fourier transform FT on the magnetic resonance data that has been modulated into the opposite phase. Further, the MR image $I_{merge}$ is generated by using the conversion image $I_{ft}$.

Further, when the MRI apparatus 100 and the image generating apparatus 1 described herein are used, the combined sensitivity distribution $S_s$ is generated by combining the gridding sensitivity distribution $S_g$ with the coil sensitivity distribution $S_c$ by using the result of the registration. Further, the MR image $I_{merge}$ is generated by implementing the sensitivity encoding (SENSE) process that uses the conversion image $I_{ft}$ and the combined sensitivity distribution $S_s$. In another example, when the MRI apparatus 100 and the image generating apparatus 1 described herein are used, the MR image $I_{merge}$ is generated by calculating the square root of the Sum of Squares (SOS) of the conversion image $I_{ft}$.

FIG. 6 is a drawing illustrating examples of generated MR images and differences between the MR images and correct answer images, with respect to a result of the image generating process performed by the MRI apparatus 100 and the image generating apparatus 1 described herein and a comparison example. As illustrated in FIG. 6, as compared to the comparison example, the result of the image generating process according to the present embodiment exhibits an improvement in the streak artifacts in the perimeter of the image region of the cross-sectional image of the MR image. In addition, as illustrated in FIG. 6, as compared to the comparison example, the result of the image generating process according to the present embodiment exhibits a noise reduction in the image region and an artifact elimination in the four corners of the MR image.

As explained above, when the MRI apparatus 100 and the image generating apparatus 1 according to the present embodiment are used, it is possible to cause the sensitivity information of the reception coil 117 to be reflected in the gridding through the registration between the coil sensitivity distributions $S_c$ and the gridding sensitivity distribution $S_g$, i.e., to cause the gridding sensitivity distribution $S_g$ to fit to the coil sensitivity distribution $S_c$, which means, in other words, it is possible to cause the high sensitivity parts of the coil sensitivity distribution $S_c$ and the gridding sensitivity distribution $S_g$ to match each other. Accordingly, by using the MRI apparatus 100 and the image generating apparatus 1 described herein, it is possible to reduce artifacts called streak having a radial formation and to improve the S/N value, when the gridding reconstruction is performed in conjunction with the non-Cartesian imaging process, which has a high acquisition speed. In other words, by using the MRI apparatus 100 and the image generating apparatus 1 described herein, it is possible to obtain the MR image $I_{merge}$ having a high diagnosis capability, while keeping small the range of occurrence of artifacts such as streak caused by the difference between the gridding sensitivity and the sensitivity of the reception coil 117 in the sensitivity map.

Second Embodiment

A difference from the first embodiment lies in that, instead of performing the phase modulation on the non-Cartesian data, a phase modulation is performed on the post-adjustment kernel function KF, so that the non-Cartesian data NCD is arranged in the k-space while using the phase-modulated kernel function, so as to generate an MR image $I_{merge}$ by using the data arranged in the k-space. In an example, when the adjusting function 153 does not adjust the kernel function related to the gridding sensitivity distribution, the phase modulation is performed either on the kernel function stored in the memory 13 or on a Fourier transform of the gridding sensitivity distribution, for example. In the following sections, to explain a specific example, it is assumed that the phase modulation in the present embodiment is performed on the kernel function adjusted by the adjusting function 153 with respect to each of the coil elements.

Next, a procedure in an image generating process according to the present embodiment will be explained, with reference to FIGS. 7 and 8. FIG. 7 is a drawing illustrating an outline of a part of the image generating process according to the present embodiment. Because the processes performed at the stage subsequent to the image generating process in FIG. 7 are the same as those in FIG. 4, those are omitted from the drawing. FIG. 8 is a flowchart illustrating an example of a procedure in the image generating process according to the present embodiment.

The Image Generating Process

Step S801:

By employing the obtaining function 151, the processing circuitry 15 obtains the non-Cartesian data NCD and the coil sensitivity distribution $S_c$. Because the details of the process at the present step are the same as those at step S501, the explanations thereof will be omitted.

Step S802:

By employing the adjusting function 153, the processing circuitry 15 adjusts the kernel function serving as a basis of the gridding sensitivity distribution, on the basis of the coil sensitivity distribution $S_c$. Because the details of the process at the present step are the same as those at step S502, the explanations thereof will be omitted. The kernel function KF adjusted by the kernel adjustment KA is indicated with the dotted line in FIG. 7.

Step S803:

By employing the registration function 155, the processing circuitry 15 performs registration between the pre-adjustment gridding sensitivity distribution and the coil sensitivity distribution $S_c$. By performing the registration between the pre-adjustment gridding sensitivity distribution and the coil sensitivity distribution $S_c$, for example, the registration function 155 calculates a shift vector extending from the coil sensitivity center-of-gravity to the gridding sensitivity center-of-gravity. Because the details of the process at the present step are the same as those at step S503, the explanations thereof will be omitted.

Step S804:

By employing the generating function 157, the processing circuitry 15 performs a phase modulation on the post-adjustment kernel function KF on the basis of the inverse vector of the shift vector (the inverse shift vector) resulting from the registration. The phase modulation on the post-adjustment kernel function KF corresponds to parallel displacement of a peak position in the kernel function KF. In other words, the phase modulation corresponds to shifting the gridding sensitivity center-of-gravity to the coil sensitivity center-of-gravity (by applying parallel displacement thereto), in the gridding sensitivity distribution corresponding to the kernel function. In other words, according to a formula of the Fourier transform, the shifting of the gridding sensitivity distribution being an image corresponds, in the k-space in which the post-adjustment kernel function is arranged, to complex modulation, i.e., applying a phase gradient that uses the inverse shift vector as the gradient.

In other words, the generating function 157 multiplies the post-adjustment kernel function KF by the phase gradient presented below and based on the inverse shift vector resulting from the registration.

$$e^{-i(\vec{k} \cdot \text{avg}(\vec{r}))}$$

As a result, the generating function 157 generates a phase-modulated kernel function PMKF. The phase modulation on the kernel function at the present step is performed, for example, with respect to each of the plurality of post-adjustment kernel functions corresponding to the plurality of coil elements. By performing a Fourier transform FT on the phase-modulated kernel function PMKF, the generating function 157 generates a post-adjustment gridding sensitivity distribution $S_g$ corresponding to the phase-modulated kernel function. The phase modulation performed on the kernel function KF at the present step is included in changing a gridding condition.

Step S805:

By employing the generating function 157, the processing circuitry 15 re-arranges the non-Cartesian data NCD into the Cartesian coordinate system of the k-space by performing a convolution calculation ACC to convolute the non-Cartesian data NCD while using the phase-modulated kernel function PMKF. The symbol "AGD" in FIG. 7 denotes the magnetic resonance data re-arranged in the Cartesian coordinate system of the k-space. As illustrated in FIG. 7, the re-arranged data AGD being arranged in the k-space and indicating the result of the convolution calculation ACC is represented by two pieces of k-space data corresponding to the absolute value and the phase, i.e., a complex number. The re-arranged data AGD has a predetermined width corresponding to the half-width with respect to an argument direction perpendicular to the radial direction and the radial direction, as a result of the convolution calculation ACC using the phase-modulated kernel function PMKF, i.e., blurring corresponding to the half-width of the kernel function PMKF, or the like.

Step S806:

By employing the generating function 157, the processing circuitry 15 performs a Fourier transform FT on the re-arranged data AGD arranged in the k-space. As a result of the Fourier transform FT, the generating function 157 generates a conversion image $I_{ft}$ illustrated in FIG. 7. The conversion image $I_{ft}$ illustrated in FIG. 7 is an image substantially the same as the conversion image $I_{ft}$ illustrated in FIG. 3.

Step S807:

By employing the generating function 157, the processing circuitry 15 generates a combined sensitivity distribution $S_s$, by combining the gridding sensitivity distribution $S_g$ resulting from the Fourier transform of the phase-modulated kernel function PMKF with the coil sensitivity distribution $S_c$. More specifically, by multiplying the gridding sensitivity distribution $S_g$ by the coil sensitivity distribution $S_c$ with respect to each of the pixels, the generating function 157 generates the combined sensitivity distribution $S_s$. Because the calculation related to the generation of the combined sensitivity distribution $S_s$ is substantially the same as that at step S507, the explanations thereof will be omitted.

Step S808:

By employing the generating function 157, the processing circuitry 15 generates an MR image $I_{merge}$ by implementing a SENSE combination that uses the combined sensitivity distribution $S_s$ and the conversion image $I_{ft}$. Alternatively, the generating function 157 may generate the MR image $I_{merge}$ by calculating an SOS or the like, in place of the SENSE combination. Because the details of the process at the present step are the same as those at step S508, the explanations thereof will be omitted.

When the MRI apparatus 100 and the image generating apparatus 1 according to the second embodiment described above are used, the phase modulation is performed on the kernel function KF serving as the basis of the gridding sensitivity distribution, by using the difference between the gridding sensitivity center-of-gravity and the coil sensitivity center-of-gravity as a result of the registration, so that the magnetic resonance data (the non-Cartesian data) NCD is arranged in the k-space while using the phase-modulated kernel function PMKF, so as to generate the MR image $I_{merge}$ by using the magnetic resonance data arranged in the k-space (the rearranged data) AGD. With these arrangements, by using the MRI apparatus 100 and the image generating apparatus 1 according to the present embodiment, it is possible to generate the MR image $I_{merge}$ more conveniently than in the image generating process according to the first embodiment. Further, because the other advantageous effects of the present embodiment are the same as those in the first embodiment, the explanations thereof will be omitted.

When technical concepts of the first embodiment and the second embodiment are realized as an image generating method, the generating method includes: obtaining the coil sensitivity distribution $S_c$ indicating the sensitivity distribution of the reception coil 117 used for the imaging process performed on the patient P and the magnetic resonance data (the non-Cartesian data) NCD acquired from the imaging process that is non-Cartesian and performed in the k-space; performing, on the basis of the coil sensitivity distribution $S_c$, the registration between the coil sensitivity distribution $S_c$ and the gridding sensitivity distribution $S_g$ indicating the distribution of the gridding sensitivity related to arranging the magnetic resonance data in the k-space; and generating the MR image $I_{merge}$, on the basis of the result of the registration, the magnetic resonance data NCD, the coil sensitivity distribution $S_c$, and the gridding sensitivity distribution $S_g$. Because the procedure and the advantageous effects of the image generating process related to the present image generating method are the same as those described in the first embodiment and those described in the second embodiment, the explanations thereof will be omitted.

When technical concepts of the first embodiment and the second embodiment are realized as an image generating program, the image generating program causes a computer to realize: obtaining the coil sensitivity distribution $S_c$ indicating the sensitivity distribution of the reception coil 117 used for the imaging process performed on the patient P and the magnetic resonance data (the non-Cartesian data) NCD acquired from the imaging process that is non-Cartesian and performed in the k-space; performing, on the basis of the coil sensitivity distribution $S_c$, the registration between the coil sensitivity distribution $S_c$ and the gridding sensitivity distribution $S_g$ indicating the distribution of the gridding sensitivity related to arranging the magnetic resonance data in the k-space; and generating the MR image $I_{merge}$, on the basis of the result of the registration, the magnetic resonance data NCD, the coil sensitivity distribution $S_c$, and the gridding sensitivity distribution $S_g$.

For example, it is possible to realize the reconstruction process by installing the image generating program in a computer provided in a modality such as the MRI apparatus 100 or a PACS server and further loading the installed program into a memory. In that situation, it is possible to distribute the program capable of causing the computer to implement the method, by storing the program into a storage medium (the non-volatile computer-readable storage medium) such as a magnetic disk (e.g., a hard disk), an optical disk (e.g., a CD-ROM, a DVD), or a semiconductor memory. Because the procedure and the advantageous effects of the image generating process realized by the image generating program are the same as those described in the first embodiment and the second embodiment, the explanations thereof will be omitted.

According to at least one aspect of the embodiments and the like described above, it is possible to generate an image having an improved S/N value, by suppressing the occurrence of the artifacts.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image generating apparatus, comprising:
   processing circuitry configured to
     obtain a coil sensitivity distribution indicating a sensitivity distribution of a reception coil used for an imaging process performed on an examined subject and magnetic resonance data acquired from the imaging process that is non-Cartesian and performed in a k-space;
     perform, based on the obtained coil sensitivity distribution, registration between the coil sensitivity distribution and a gridding sensitivity distribution indicating a distribution of gridding sensitivity related to arranging the magnetic resonance data in the k-space; and
     generate a magnetic resonance image based, on of a result of the registration, the magnetic resonance data, the coil sensitivity distribution, and the gridding sensitivity distribution.

2. The image generating apparatus according to claim 1, wherein
   as a result of the registration, the processing circuitry is further configured to calculate a difference between a sensitivity center-of-gravity in the gridding sensitivity distribution and a sensitivity center-of-gravity in the coil sensitivity distribution,
   the processing circuitry is further configured to perform a phase modulation on the magnetic resonance data, by using the calculated difference,
   the processing circuitry is further configured to arrange the phase-modulated magnetic resonance data in the k-space, by using a kernel function serving as a basis of the gridding sensitivity, and
   the processing circuitry is further configured to generate the magnetic resonance image by using the magnetic resonance data arranged in the k-space.

3. The image generating apparatus according to claim 1, wherein
   as a result of the registration, the processing circuitry is further configured to calculate a difference between a sensitivity center-of-gravity in the gridding sensitivity distribution and a sensitivity center-of-gravity in the coil sensitivity distribution,
   the processing circuitry is further configured to perform a phase modulation on a kernel function serving as a basis of the gridding sensitivity distribution, by using the difference,
   the processing circuitry is further configured to arrange the magnetic resonance data in the k-space by using the phase-modulated kernel function, and
   the processing circuitry is further configured to generate, the magnetic resonance image by using the magnetic resonance data arranged in the k-space.

4. The image generating apparatus according to claim 1, wherein
   the processing circuitry is further configured to generate a conversion image, by performing a phase modulation on the magnetic resonance data, by applying a difference between a sensitivity center-of-gravity in the gridding sensitivity distribution and a sensitivity center-of-gravity in the coil sensitivity distribution, to a Fourier transform performed on the magnetic resonance data arranged in the k-space and further performing parallel displacement so as to correspond to a phase opposite to the phase modulation based on the difference, and
   the processing circuitry is further configured to generate the magnetic resonance image by using the conversion image.

5. The image generating apparatus according to claim 1, wherein
   the processing circuitry is further configured to perform a phase modulation on the magnetic resonance data by using a difference between a sensitivity center-of-gravity in the gridding sensitivity distribution and a sensitivity center-of-gravity in the coil sensitivity distribution and further modulates the magnetic resonance data arranged in the k-space into a phase opposite to the phase modulation based on the difference,
   the processing circuitry is further conficured to_generate a conversion image by performing a Fourier transform on the magnetic resonance data modulated into the opposite phase, and
   the processing circuitry generates is further configured to generate, the magnetic resonance image by using the conversion image.

6. The image generating apparatus according to claim 1, wherein
   the reception coil includes a plurality of coil elements,
   the processing circuitry is further configured to obtain the coil sensitivity distribution and the magnetic resonance data with respect to each of the plurality of coil elements,
   based on the coil sensitivity distributions, the processing circuitry is further configured to perform registration between a corresponding one of the coil sensitivity distributions and the gridding sensitivity distribution with respect to each of the plurality of coil elements, and
   the processing circuitry is further configured to generate the magnetic resonance image based on a plurality of results of the registration, the plurality of magnetic resonance data, and the plurality of coil sensitivity distributions, and the plurality of gridding sensitivity distributions.

7. The image generating apparatus according to claim 1, wherein the processing circuitry is further configured to generate a conversion image through one of the following: (a) performing a phase modulation on the magnetic resonance data, by applying a difference between a sensitivity center-of-gravity in the gridding sensitivity distribution and a sensitivity center-of-gravity in the coil sensitivity distribution to a Fourier transform performed on the magnetic resonance data arranged in the k-space and further performing parallel displacement so as to correspond to a phase opposite to the phase modulation based on the difference; and (b) modulating, based on the difference, the magnetic resonance data arranged in the k-space into a phase opposite to the phase modulation and further performing a Fourier transform on the magnetic resonance data modulated into the opposite phase, the processing circuitry is further configured to generate a combined sensitivity distribution by cot bining the gridding sensitivity distribution with the coil sensitivity distribution while using a result of the registration, and the processing circuitry is further configured to generate the magnetic resonance image by performing a sensitivity encoding process while using the conversion image and the combined sensitivity distribution.

8. The image generating apparatus according to claim 1, wherein the processing is further configured to generate a conversion image through one of the following: (a) performing a phase modulation on the magnetic resonance data, by applying a difference between a sensitivity center-of-gravity in the gridding sensitivity distribution and a sensitivity center-of-gravity in the coil sensitivity distribution to a Fourier transform performed on the magnetic resonance data arranged in the k-space and further performing parallel displacement so as to correspond to a phase opposite to the phase modulation based on the difference; and (b) modulating, based on the difference, the magnetic resonance data arranged in the k-space into a phase opposite to the phase modulation and further performing a Fourier transform on the magnetic resonance data modulated into the opposite phase, and the processing circuitry is further configured to generate, the magnetic resonance image by calculating a square root of a sum of squares of the conversion image.

9. The image generating apparatus according to claim 1, wherein the processing circuitry is further conticured to generate a conversion image through one of the following: (a) performing a phase modulation on the magnetic resonance data, by applying a difference between a sensitivity center-of-gravity in the gridding sensitivity distribution and a sensitivity center-of-gravity in the coil sensitivity distribution to a Fourier transform performed on the magnetic resonance data arranged in the k-space and further performing parallel displacement so as to correspond to a phase opposite to the phase modulation based on the difference; and (b) modulating, based on the difference, the magnetic resonance data arranged in the k-space into a phase opposite to the phase modulation and further performing a Fourier transform on the magnetic resonance data modulated into the opposite phase, the processing circuitry generates is further configured to generate a de-shaded image in which shading in the conversion image is reduced, by dividing the conversion image by the gridding sensitivity distribution, and the processing circuitry is further configured to generate the magnetic resonance image through one of the following: performing a sensitivity encoding process while using the de-shaded image and the coil sensitivity distribution; and calculating a square root of a sum of squares of the de-shaded image.

10. The image generating apparatus according to claim 1, wherein based on the coil sensitivity distribution, the processing circuitry is further configured to adjust one of an envelope shape and a half-width of a kernel function serving as a basis of the gridding sensitivity distribution, and the processing circuitry is further configured to generate the magnetic resonance image based on a result of the registration, the magnetic resonance data, the coil sensitivity distribution, and the gridding sensitivity distribution corresponding to the adjusted kernel function.

11. The image generating apparatus of claim 1, wherein the processing circuitry is further configured to calculate, in performing the registration, a vector from a point in the coil sensitivity distribution to a point in the gridding sensitivity distribution.

12. An image generating method comprising:

obtaining a coil sensitivity distribution indicating a sensitivity distribution of a reception coil used for an imaging process performed on an examined subject and magnetic resonance data acquired from the imaging process that is non-Cartesian and performed in a k-space;

performing, based on the coil sensitivity distribution, registration between the coil sensitivity distribution and a gridding sensitivity distribution indicating a distribution of gridding sensitivity related to arranging the magnetic resonance data in the k-space; and generating a magnetic resonance image based on a result of the registration, the magnetic resonance data, the coil sensitivity distribution, and the gridding sensitivity distribution.

13. A non-transitory computer-readable storage medium storing therein an image generating program that causes a computer to realize:

obtaining a coil sensitivity distribution indicating a sensitivity distribution of a reception coil used for an imaging process performed on an examined subject and magnetic resonance data acquired from the imaging process that is non-Cartesian and performed in a k-space;

performing, based on the coil sensitivity distribution, registration between the coil sensitivity distribution and a gridding sensitivity distribution indicating a distribution of gridding sensitivity related to arranging the magnetic resonance data in the k-space; and generating a magnetic resonance image based on a result of the registration, the magnetic resonance data, the coil sensitivity distribution, and the gridding sensitivity distribution.

* * * * *